(12) United States Patent
Yeates

(10) Patent No.: US 8,731,218 B2
(45) Date of Patent: May 20, 2014

(54) DEFORMABLE CONTROLLER FOR ELECTRONIC DEVICE

(75) Inventor: Kyle Yeates, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 1369 days.

(21) Appl. No.: 12/101,039

(22) Filed: Apr. 10, 2008

(65) Prior Publication Data

US 2009/0257604 A1  Oct. 15, 2009

(51) Int. Cl.
*H03G 3/00* (2006.01)
(52) U.S. Cl.
USPC .......................................... 381/109; 381/105
(58) Field of Classification Search
USPC .................. 381/105, 370, 384, 374, 386, 109
See application file for complete search history.

(56) References Cited

U.S. PATENT DOCUMENTS

| 4,869,683 A | 9/1989 | Nelson |
| 5,821,480 A | 10/1998 | Machida |
| 6,007,377 A | 12/1999 | Cook |
| 7,011,213 B2 | 3/2006 | Clark et al. |
| 7,236,751 B2 * | 6/2007 | Ono ............................... 455/90.3 |
| 7,427,711 B2 * | 9/2008 | O'Modhrain et al. ........... 84/742 |
| 7,539,317 B2 * | 5/2009 | Aiso et al. ....................... 381/104 |
| 8,094,673 B2 * | 1/2012 | Proctor et al. ................. 370/462 |
| 2007/0206829 A1 * | 9/2007 | Weinans et al. ............... 381/370 |
| 2008/0187160 A1 | 8/2008 | Kim |
| 2008/0278443 A1 * | 11/2008 | Schelling et al. ............. 345/157 |
| 2009/0242364 A1 | 10/2009 | Prest |
| 2011/0317855 A1 * | 12/2011 | Andersson et al. ........... 381/109 |

\* cited by examiner

*Primary Examiner* — Disler Paul
(74) *Attorney, Agent, or Firm* — Brownstein Hyatt Farber Schreck, LLP

(57) ABSTRACT

A deformable controller for an electronic device, such as a portable electronic device, is disclosed. A user can interact with the controller to cause it to "deform" and thereby provide user input to control the electronic device. The controller can be malleable and symmetrical, and user interaction with the controller can be provided with substantially arbitrary orientation. In one embodiment, the controller is an in-line controller with a cable that couples to the electronic device. In one particular implementation, the portable electronic device can be a portable media player and the controller can remotely control media playback functions for the portable media player.

9 Claims, 5 Drawing Sheets

DEFORMABLE CONTROLLER FOR ELECTRONIC DEVICE

BACKGROUND OF THE INVENTION

1. Field of the Invention

The present invention relates to user-activated controllers and, more particularly, to user-activated controllers for portable electronic devices.

2. Description of the Related Art

Portable electronic devices, such as mobile phones, MP3 players and Personal Digital Assistants (PDAs), are often used by individuals on a personal basis. In other words, it is not uncommon for a person to carry a portable electronic device with them throughout their day. Often, these portable electronic devices store media data for subsequent playback by their user.

Many users keep their portable electronic device in his or her pocket or in a wearable holder, while at least partially controlling the device using a controller located on a headphone assembly. By way of example, incorporating a controller having one or more switches onto a headphone (or earpiece) assembly that can be plugged into or otherwise interfaced with a portable electronic device allows a user to at least partially control the portable electronic device without accessing controls actually on the portable electronic device. Consequently, a controller can be used to at least partially control a portable electronic device remote from the portable electronic device itself.

If a controller is relatively large, it may be unwieldy. For example, if a relatively large controller is coupled to a headphone assembly, a user may find the presence of the controller to be inconvenient and cumbersome. As such, the convenience of having a controller may be hindered. On the other hand, if a controller is relatively small, it may be difficult to activate accurately. For instance, if a relatively small controller is coupled to a headphone assembly and includes buttons which control different features of a portable electronic device, a user may inadvertently activate one feature while attempting to activate another feature, as actuating small buttons that are closely positioned can be difficult. Moreover, a user may wish to use a controller without looking at the controller. Hence, the user may effectively be using his or her sense of touch to identify a desired button to actuate. That is, the user may use his or her tactile senses to locate a desired button to actuate. When a controller is relatively small, there may be relatively high likelihood that the user will either actuate the wrong button on the controller, or may inadvertently actuate more than one button on the controller.

Therefore, there is a need for an improved controller that provides more accurate use yet is relatively small and easy to use.

SUMMARY OF THE INVENTION

The invention pertains to a controller that can be deformed. The controller can be used to control an electronic device, such as a portable electronic device. A user can interact with the controller to cause it to "deform" and thereby provide user input to control the electronic device. The controller can be malleable and symmetrical, and user interaction with the controller can be provided with substantially arbitrary orientation. In one embodiment, the controller is an in-line controller with a cable that couples to the electronic device. In one particular implementation, the portable electronic device can be a portable media player and the controller can remotely control media playback functions for the portable media player.

The invention can be implemented in numerous ways, including as a method, system, device, or apparatus (including or computer readable medium). Several embodiments of the invention are discussed below.

As a deformable controller for a portable electronic device, one embodiment of the invention can, for example, include at least a deformable outer shell, and a plurality of electrical contacts internal to the deformable outer shell.

As a method for commanding a portable electronic device, one embodiment of the invention can, for example, include at least: receiving at least one input signal from a deformable controller, the at least one input signal being produced in response to user manipulation of the deformable controller; determining whether the at least one input signal corresponds to a rolling action from the user manipulation; initiating, on the portable electronic device, a predetermined command that corresponds to the rolling action if it is determined that the at least one input signal corresponding to the rolling action; determining whether the at least one input signal corresponds to a press action from the user manipulation; and initiating, on the portable electronic device, another command that corresponds to the press action if it is determined that the at least one input signal corresponds to the press action.

As a portable media system, one embodiment of the invention includes at least: a portable media player adapted to play back one or more media items; and a cable having at least one earpiece at a first end, a connector at a second end, and an in-line controller adhered to said cable. The in-line controller is adapted to be deformed by user interaction therewith to signal the portable media player to invoke one or more of a plurality of media playback commands.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to a controller that can be deformed. The controller can be used to control an electronic device, such as a portable electronic device. A user can interact with the controller to cause it to "deform" and thereby provide user input to control the electronic device. The controller can be malleable and symmetrical, and user interaction with the controller can be provided with substantially arbitrary orientation. In one embodiment, the controller is an in-line controller with a cable that couples to the electronic device. In one particular implementation, the portable electronic device can be a portable media player and the controller can remotely control media playback functions for the portable media player.

Embodiments of the invention are discussed below with reference to FIGS. 1-6. However, those skilled in the art will readily appreciate that the detailed description given herein with respect to these figures is for explanatory purposes as the invention extends beyond these limited embodiments.

Figure 1:
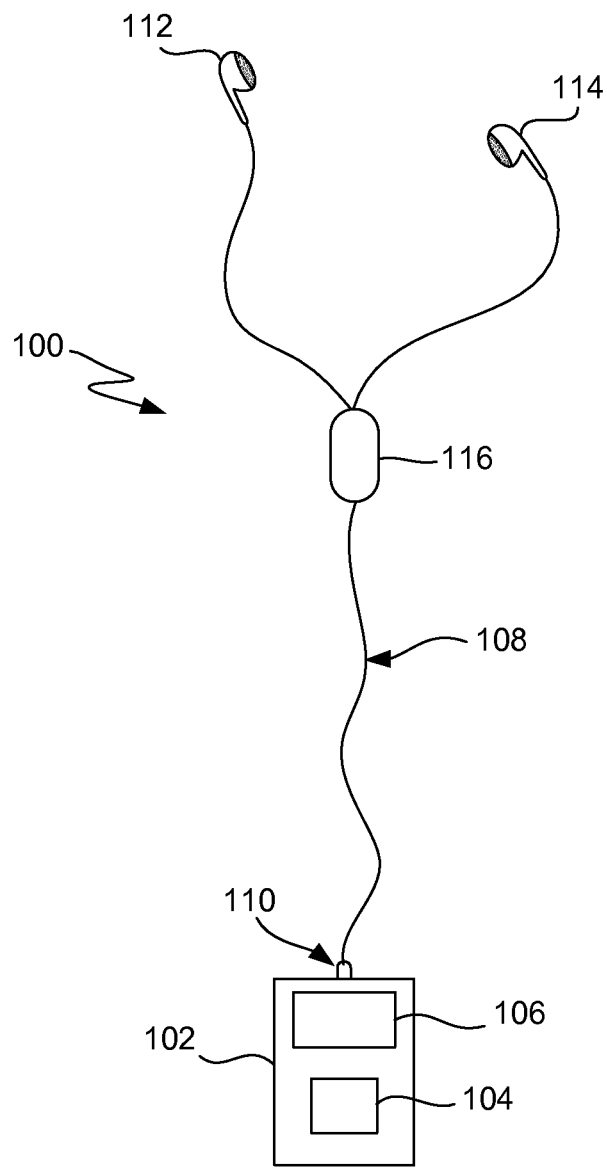
FIG. 1 illustrates a portable media system according to one embodiment of the invention.

FIG. 1 illustrates a portable media system 100 according to one embodiment of the invention. The portable media system 100 includes a portable media player 102. The portable media player 102 is capable of playing one or more digital media assets (e.g., media items) for the benefit of a user of the portable media system 100. The portable media player 102 can include a user input device 104 and a user output device 106. For example, the user input device 104 can correspond to a button, a touchpad, a keypad, a keyboard, a jog dial, a ball, a joystick, a dial, etc. The user output device 106 can, for example, pertain to a display or a speaker.

The portable media system 100 also includes a cord 108. The cord 108 has a connector 110 at one end and earpieces 112 and 114 at another end. The cord 108 can divide into two regions proximate to the end having the earpieces 112 and 114. The earpieces 112 and 114 can be placed within the ears of the user of the portable media system 100. The connector 110 can serve to electrically and physically connect the cord 108. Once the connector 110 connects with the portable media player 102, the portable media player 102 can supply electrical signals to the earpieces 112 and 114, which can produce an audio output for the user. The earpieces 112 and 114 can, in one embodiment, pertain to a headset.

The cord 108 can also include a controller 116. The controller 116 is provided on the cord 108. The controller 116 can be adhered to the cord 108 in a variety of different ways. For example, the controller 116 can be formed as part of the cord 108 or can be attached to the cord 108. The controller 116 can be referred to as an in-line controller. In one embodiment, the controller 116 is a deformable controller.

The deformable controller 116 can be malleable or soft and able to be easily deformed by the user. Although the deformable controller 116 can be formed from a wide range of materials depending on implementation. As one example, the outer shell for the deformable controller 116 can be a soft silicon material. As another example, the outer shell for the deformable controller 116 can be a rubber material. The amount of deformability is dependent on the material and construction of the deformable controller 116. The deformable controller 116 can have a symmetric outer appearance, with preferably no particular button surfaces. The deformable controller 116, however, can be manipulated by the user through pressing, rotating or twisting to initiate one or more commands. More particularly, a user of the portable media system 100 can interact with the controller 116 to request or initiate a plurality of different commands. For example, with respect to media playback, the controller 116 can be manipulated by the user to signal the portable media player 102 to perform various different commands associated with media playback. As an example, the various different commands associated with media playback can include play, pause, fast forward, volume up, volume down, next and previous. As another example, if the portable media player 102 supports a communication function (mobile phone), then the controller 116 could also invoke communication functions, such as answer call, end call, microphone on, or microphone off.

Although the controller 116 can permit a user to request various different commands, in one embodiment, the controller 116 does not include any individualized buttons or indicia therefor. Instead, user positioning and interaction with respect to the controller 116 is largely arbitrary. For example, a user can press the controller 116 to cause it to deform and thus need not press at a specific place or on a specific button. As another example, a user can roll or twist the controller 116 to cause it to deform and thus can orient the roll or twist from almost any arbitrary finger placement about the controller 116. Hence, the controller 116 is user friendly and easily utilized in an intuitive manner without needing to visually see the controller 116.

In an alternative embodiment, the portable media system 100 can utilize a cord having only a single earpiece. The single earpieces can, in one embodiment, pertain to a headset.

Additionally, one embodiment of the portable media system 100 can include a microphone attached to the cord. For example, a microphone can be provided integral with the controller 116 or attached to the controller. For example, in one embodiment, a portion (e.g., an upper portion) of the controller 116 could be dedicated to a microphone (and such portion may not be deformable).

In one embodiment, the rolling or twisting induced by user manipulation can be isolated from the cord (or cable). For example, in one implementation, the rolling or twisting user interaction provided to the controller 116 can be isolated from the cord such that the rolling or twisting user interaction of the controller 116 (e.g., rolling or twisting of an deformable outer shell of the controller) does not impose rolling or twisting of the cord.

Further, more generally, it should be noted that in other embodiments the deformable controller 116 can be manipulated by the user through any one or more of: pressing, pinching, rolling, bending, sliding, squeezing, rotating or twisting to initiate one or more commands. The manipulation of the deformable controller 116 can initiate a command from not only a single action with the deformable controller 116 but also multiple combinations of actions with the deformable controller. For example, a particular command can be initiated if the user presses (or squeezes or pinches) and also rotates (or twists or rolls).

Figure 2:
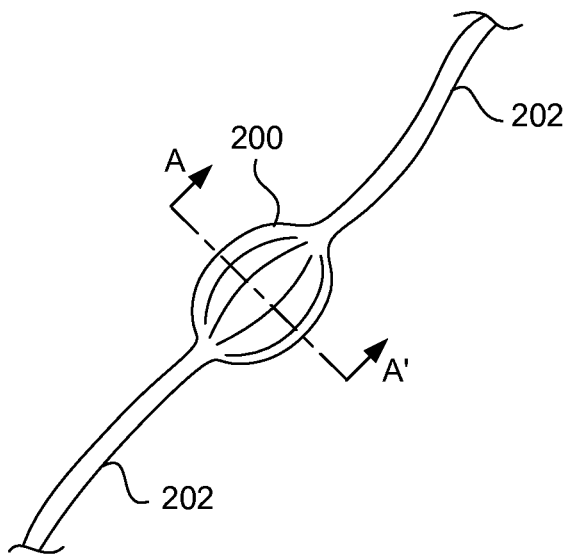
FIG. 2 is a perspective diagram of a deformable controller according to one embodiment of the invention.

FIG. 2 is a perspective diagram of a deformable controller 200 according to one embodiment of the invention. The deformable controller 200 is formed or attached to a cord 202. The deformable controller 200 can represent one embodiment of the controller 116 illustrated in FIG. 1, and the cord 202 can represent a portion of the cord 108 illustrated in FIG. 1. The deformable controller 200 has a symmetrical shape that is capable of being easily deformed by a user. In one scenario, a user can press the deformable controller 200 to signal one or more commands. In another scenario, a user can roll or twist the deformable controller 200 to signal one or more commands. For example, rolling or twisting of the deformable controller 200 can be performed between a pair of the user's fingers without regard to particular orientation with respect to the deformable controller 200. In other words, the rolling or twisting can be initiated at any arbitrary rotational position about the axis of the cord 202 with respect to the deformable controller 200. Likewise, the pressing of the deformable controller 200 can be initiated at any arbitrary rotational position with respect to the deformable controller 200.

Figure 3A:
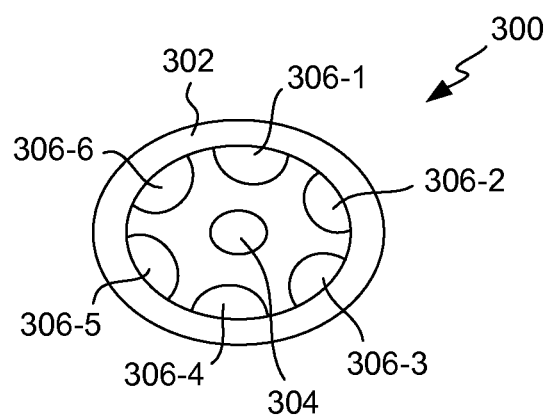
FIG. 3A is a cross-sectional view of a deformable controller according to one embodiment of the invention.

FIG. 3A is a cross-sectional view of a deformable controller 300 according to one embodiment of the invention. The deformable controller 300 can, for example, represent one embodiment of the deformable controller 200 illustrated in FIG. 2 with reference to a sectional line A-A' shown in FIG. 2. The deformable controller 300 has an outer shell 302 that can be deformed by user manipulation. At a center region within the outer shell 302 is disposed a central electrical contact 304. In addition, outer electrical contacts 306 are provided on an inner surface of the outer shell 302. These outer electrical contacts 306 are dispersed about the inner surface of the outer shell 302 and are denoted as outer electrical contacts 306-1, 306-2, 306-3, 306-4, 306-5 and 306-6.

Figure 3B:
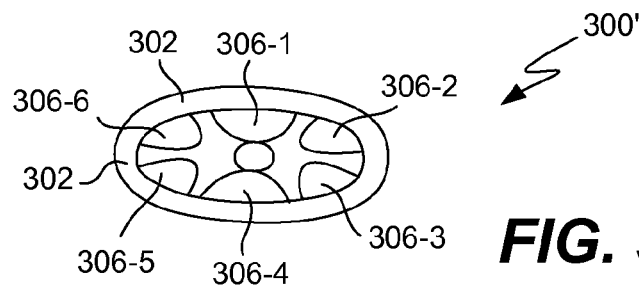
FIG. 3B illustrates the deformable controller shown in FIG. 3A in a first deformed position.
Figure 3C:
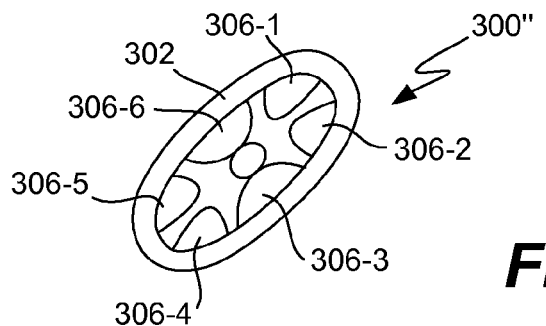
FIG. 3C illustrates the deformable controller shown in FIG. 3A in a second deformed position.

In FIG. 3A, the deformable controller 300 is shown in an undeformed state. In the undeformed state, none of the outer electrical contacts 306 electrically connect to the central electrical contact 304. When the deformable controller 300 is manipulated by a user, the deformable controller 300 is deformed in any of a variety of different ways. FIGS. 3B and 3C are cross-sectional views of the deformable controller 300 in certain deformed shapes.

FIG. 3B illustrates the deformable controller 300' being deformed by a user of pressing the deformable controller 300 between two fingers, one finger placed on the outer shell 302 proximate to the outer electrical contact 306-1 and the other finger placed proximate to the outer electrical contact 306-4. As shown in FIG. 3B, in the illustrated deformed state, the outer electrical contacts 306-1 and 306-4 are in electrical contact with the central electrical contact 304, while none of the other outer electrical contacts 306-2, 306-3, 306-5 and 306-6 contact the central electrical contact 304.

FIG. 3C illustrates the deformable controller 300" being deformed by a user of pressing the deformable controller 300 between two fingers, one finger placed on the outer shell 302 proximate to the outer electrical contact 306-3 and the other finger placed proximate to the outer electrical contact 306-6. As shown in FIG. 3C, in the illustrated deformed state, the outer electrical contacts 306-3 and 306-6 are in electrical contact with the central electrical contact 304, while none of the other outer electrical contacts 306-1, 306-2, 306-4 and 306-5 contact the central electrical contact 304.

In the case in which the deformable controller 300 is pressed by the user manipulation, FIGS. 3B and 3C can represent positions of the deformable controller 300 when undergoing a press action.

In the case in which the deformable controller 300 is rotated or twisted by the user manipulation, FIGS. 3B and 3C can represent momentary deformed positions of the deformable controller 300. These deformed positions can momentarily follow one another. For example, if the user initially manipulates the deformable controller 300' to the position shown in FIG. 3B, then by further clockwise rotation (or twisting), the user can cause the deformable controller 300" to be deformed in the manner illustrated in FIG. 3C.

Figure 4A:
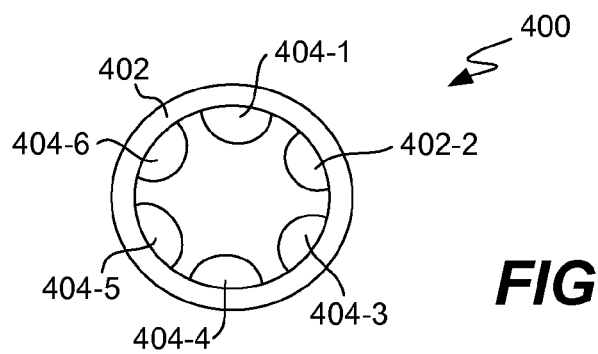
FIG. 4A is a cross-sectional view of a deformable controller according to one embodiment of the invention.

FIG. 4A is a cross-sectional view of a deformable controller 400 according to one embodiment of the invention. The deformable controller 400 can, for example, represent one embodiment of the deformable controller 200 illustrated in FIG. 2 with reference to a sectional line A-A' shown in FIG. 2. The deformable controller 400 has an outer shell 402 that can be deformed by user manipulation. In this embodiment there is no center contact as was the case with the deformable controller 300 illustrated in FIG. 3A. However, the deformable controller 402 does include outer electrical contacts 404 provided on an inner surface of the outer shell 402. These outer electrical contacts 404 are dispersed about the inner surface of the outer shell 402 and are denoted as outer electrical contacts 404-1, 404-2, 404-3, 404-4, 404-5 and 404-6.

Figure 4B:
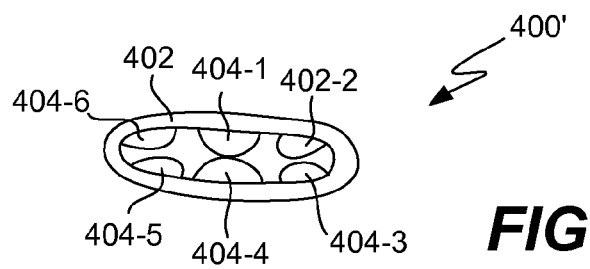
FIG. 4B illustrates the deformable controller shown in FIG. 4A in a first deformed position.
Figure 4C:
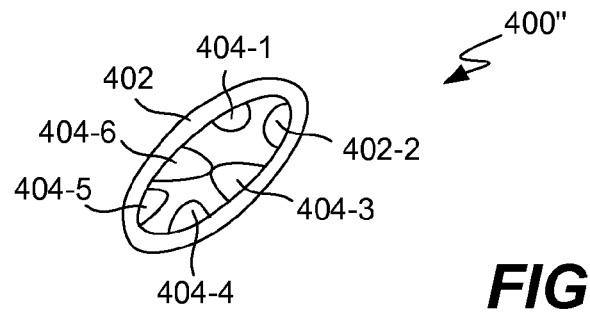
FIG. 4C illustrates the deformable controller shown in FIG. 4A in a second deformed position.

In FIG. 4A, the deformable controller 400 is shown in an undeformed state. In the undeformed state, none of the outer electrical contacts 404 electrically connect with one another. When the deformable controller 400 is manipulated by a user, the deformable controller 400 is deformed in any of a variety of different ways. FIGS. 4B and 4C are cross-sectional views of the deformable controller 400 in certain deformed shapes.

FIG. 4B illustrates the deformable controller 400' being deformed by a user of pressing the deformable controller 400 between two fingers, one finger placed on the outer shell 402 proximate to the outer electrical contact 404-1 and the other finger placed proximate to the outer electrical contact 404-4. As shown in FIG. 4B, in the illustrated deformed state, the outer electrical contacts 404-1 and 404-4 are in electrical contact with each other, while none of the other outer electrical contacts 404-2, 404-3, 404-5 and 404-6 are in electrical contact with any other of the outer electrical contacts 404.

FIG. 4C illustrates the deformable controller 400" being deformed by a user of pressing the deformable controller 400 between two fingers, one finger placed on the outer shell 402 proximate to the outer electrical contact 404-3 and the other finger placed proximate to the outer electrical contact 404-6. As shown in FIG. 4C, in the illustrated deformed state, the outer electrical contacts 404-3 and 404-6 are in electrical contact with each other, while none of the other outer electrical contacts 404-1, 404-2, 404-4 and 404-5 are in electrical contact with any other of the outer electrical contacts 404.

In the case in which the deformable controller 400 is pressed by the user manipulation, FIGS. 4B and 4C can represent positions of the deformable controller 400 when undergoing a press action.

In the case in which the deformable controller 400 is rotated or twisted by the user manipulation, FIGS. 4B and 4C can represent momentary deformed positions of the deformable controller 400. These deformed positions can momentarily follow one another. For example, if the user initially manipulates the deformable controller 400' to the position shown in FIG. 4B, then by further clockwise rotation (or twisting), the user can cause the deformable controller 400" to be deformed in the manner illustrated in FIG. 4C.

While the embodiment illustrated in FIGS. 3A-3C and 4A-4C are embodiment that use inner and outer contacts, alternative electrical components can be used. In one example, the deformable controller can, besides electrical contacts, made use of force sensitive devices, tact switches, or touch sensors on or within the deformable controller.

In one embodiment, the deformable controller can determine a force with which the deformable controller is being deformed (e.g., rolled, squeezed, pinched, pressed, twisted) and use such to command (or influence commands) for an electronic device. For example, the force with which a pressing of the deformable controller is performed can influence a command, such as influencing a degree of volume change, a rate of fast forward/reverse, etc.

Although not shown in FIGS. 3A or 4A, a deformable controller can also provide tactile and/or audio feedback to a user when the user acts to deform the deformable controller. In one embodiment, at least one tactile feedback element can be provided internal to an outer shell of the deformable controller. The tactile feedback can, for example, serve to inform the user that a user manipulation (e.g., press, roll, twist, etc.)

of the deformable controller has been recognized. In one embodiment, audio feedback can be electrically induced by an electronic device.

Also, in another embodiment, the deformable controller need not have a deformable outer shell. The deformable controller can be constructed from a uniform body, such as an encapsulated body for the deformable controller. In still another embodiment, the deformable controller can have a multi-layer construction. For example, the deformable controller can have an inner layer and an outer layer, wherein the inner layer can support inner electrodes and the outer layer can support outer electrodes.

Figure 5:
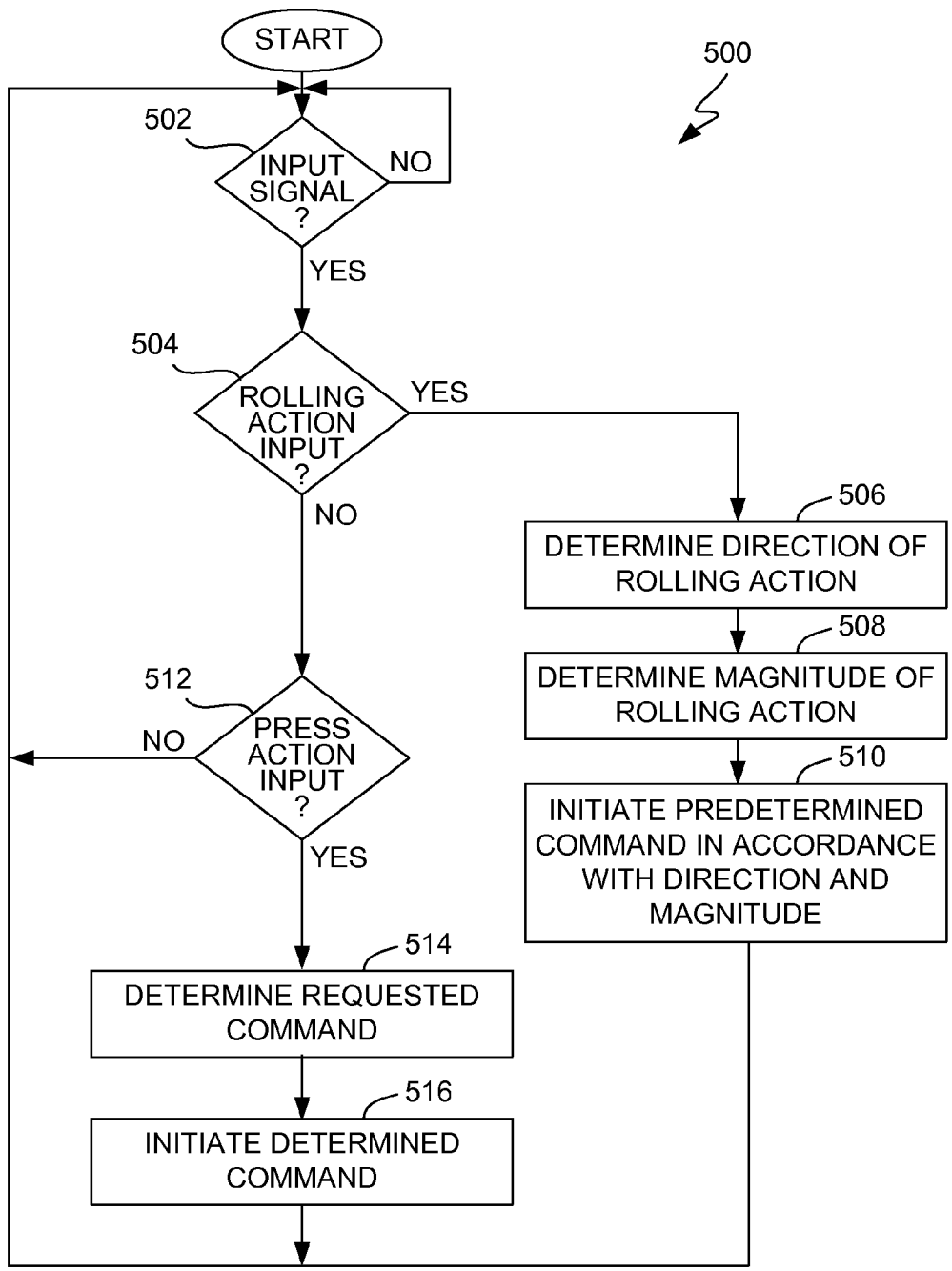
FIG. 5 is a flow diagram of a device control process according to one embodiment of the invention.

FIG. 5 is a flow diagram of a device control process 500 according to one embodiment of the invention. The device control process 500 is, for example, performed by a portable media device, such as the portable media player 102 illustrated in FIG. 1.

The device control process 500 can begin with a decision 502 that determines whether an input signal has been received. Here, the input signal, if received, is provided to the portable media device by a controller, such as the controller 116 illustrated in FIG. 1. That is, the input signal can correspond to one or more signals provided by the controller to reflect one or more user manipulations with respect to the controller. When the decision 502 determines that an input signal has not been received, the device control process 500 can await such a signal.

On the other hand, when the decision 502 determines that an input signal has been received, the device control process 500 can perform a decision 504 that determines whether the input signal corresponds to a rolling action input. Here, the controller for the portable media device can receive a rolling action input or a press action input from a user. At the decision 504, the device control process 500 determines whether the input signal corresponds to a rolling action input. When the decision 504 determines that the input signal does correspond to a rolling action input, a direction of the rolling action is then determined 506. In addition, a magnitude (or quantity) for the rolling action can be determined 508. The magnitude for the rolling action can, for example, correspond to the extent to which the user rolls or twists the controller. Thereafter, a predetermined command can be initiated 510 in accordance with the direction and magnitude. Here, in this embodiment, the rolling action with respect to the controller signals the portable media player to perform a predetermined command. For example, in the context of media playback, the rolling action could cause a predetermined command to be performed such as volume up, volume down, next (or fast forward) or previous (or rewind).

Alternatively, when the decision 504 determines that the input signal does not correspond to a rolling action input, a decision 512 can determine whether the input signal corresponds to a press action input. At the decision 512, the device control process 500 determines whether the input signal corresponds to a press action input. When the decision 512 determines that the input signal does correspond to a press action input, the requested command can be determined 514. Here, in one embodiment, the press action input can signal a plurality of different commands. Hence, the user manipulation that produces the press action input can signal one of a plurality of different commands depending upon the nature of the user manipulation. For example, a single press action can signal a first command and a double press action can signal a second command. After the requested command has been determined 514, the determined command can be initiated 516. For example, the different commands that can be initiated in response to the press action input can include play, pause, or fast-forward.

Following the blocks 510 and 516, the device control process 500 can return to repeat the decision 502 and subsequent blocks so that subsequent input signals resulting from user interaction with the controller can be processed in a similar fashion. Also, following the decision 512 when the decision 512 determines that the input signal does not correspond to a press action input, the device control process 500 can return to repeat the decision 502 and subsequent blocks.

To assist with distinguishing between a press action input and a rolling action input, in one embodiment, the various electrical contacts of the controller can have or be associated with different resistance levels. The electronic device evaluating the input signals from the controller can then electrically distinguish the different contacts being connected during user manipulation which can be useful to detect direction and/or magnitude (amount) of rolling or twisting. For example, in one embodiment, a central contact can be connected to one wire and all of the outer contacts can be connected to a second wire. User manipulation can then yield different resistive levels across the pair of wires as user inputs, e.g., press action inputs or rolling action inputs, are received. These resistance levels can be used to distinguish not only type of user input but also direction, magnitude and/or duration in some cases.

Portable media devices can also be referred to as mobile media devices. Portable media devices can, for example, be portable digital media players (e.g., MP3 players) or other portable multi-function devices (e.g., mobile telephones or Personal Digital Assistants). Portable media devices, such as portable media players or other portable multi-function devices, can also be small and highly portable and have limited processing resources. Often, portable devices are handheld devices, such as hand-held media players or hand-held multi-function devices, which can be easily held by and within a single hand of a user. Portable devices can also be pocket-sized, miniaturized or wearable.

Figure 6:
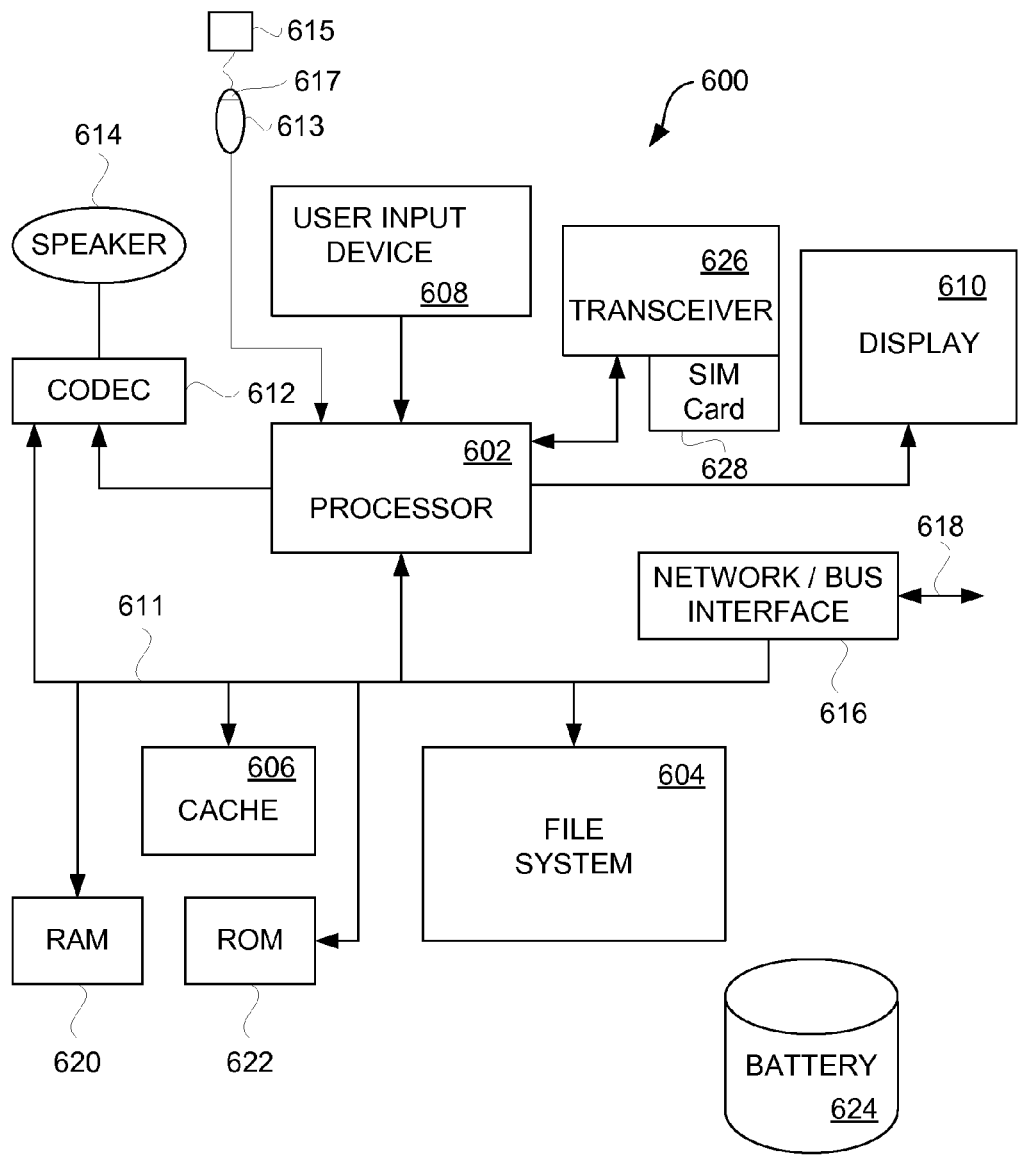
FIG. 6 is a block diagram of a mobile multi-function device according to one embodiment of the invention.

FIG. 6 is a block diagram of a mobile multi-function device 600 according to one embodiment of the invention. The mobile multi-function device 600 can, for example, include the circuitry of the portable media player 102 illustrated in FIG. 1. The mobile multi-function device 600 includes hardware and software components to provide at least two functions, namely, a media playback function and a wireless voice communications function. When providing media playback, the mobile multi-function device 600 can operate as a media player capable of playing (including displaying) media items. The media items can, for example, pertain to audio items (e.g., audio files or songs), videos (e.g., movies) or images (e.g., photos), as different types of media assets. Media assets can also include any combinations of these different type of media assets with other data. When providing wireless voice communications, the mobile multi-function device 600 can operate a mobile telephone (e.g., cellular phone).

The mobile multi-function device 600 includes a processor 602 that pertains to a microprocessor or controller for controlling the overall operation of the mobile multi-function device 600. The mobile multi-function device 600 stores media data pertaining to media items in a file system 604 and a cache 606. In one embodiment, the file system 604 is implemented by a storage disk or a plurality of disks. In another embodiment, the file system 604 is implemented by EEPROM or Flash type memory. The file system 604 typically provides high capacity storage capability for the mobile multi-function device 600. However, since the access time to the file system 604 is relatively slow, the mobile multi-function device 600 can also include a cache 606. The cache 606 is, for example, Random-Access Memory (RAM) provided by semiconductor memory. The relative access time to the cache 606 is substantially shorter than for the file system 604. However, the cache 606 does not have the large storage capacity of the file system 604. Further, the file system 604, when active, consumes more power than does the cache 606. The power consumption is often a concern when the mobile multi-function device 600 is a portable mobile multi-function device that is powered by a battery (not shown). The mobile multi-function device 600 also includes a RAM 620 and a Read-Only Memory (ROM) 622. The ROM 622 can store programs, utilities or processes to be executed in a non-volatile manner. The ROM 622 can be implemented by an EEPROM or Flash type memory so as to provide writable non-volatile data storage. The RAM 620 provides volatile data storage, such as for the cache 606.

To support wireless voice communications, the mobile multi-function device 600 includes a transceiver 626. The transceiver 626 supports wireless communication with a wireless network (such as a wireless cellular network). To support certain wireless networks, such as a GSM network, the multi-function device 600 can also include a SIM card 628. The SIM card 628 includes an identifier (e.g., SIM identifier) can be used by the mobile multi-function device 600 to gain access and utilize the wireless network.

The mobile multi-function device 600 also includes a user input device 608 that allows a user of the mobile multi-function device 600 to interact with the mobile multi-function device 600. For example, the user input device 608 can take a variety of forms, such as a button, keypad, dial, etc.

Still further, the mobile multi-function device 600 includes a display 610 (screen display) that can be controlled by the processor 602 to display information to the user. A data bus 611 can facilitate data transfer between at least the file system 604, the cache 606, the processor 602, and the CODEC 612.

In one embodiment, the mobile multi-function device 600 serves to store a plurality of media items (e.g., songs) in the file system 604. When a user desires to have the mobile multi-function device play a particular media item, a list of available media items is displayed on the display 610. Then, using the user input device 608, a user can select one of the available media items. The processor 602, upon receiving a selection of a particular media item, supplies the media data (e.g., audio file) for the particular media item to a coder/decoder (CODEC) 612. The CODEC 612 then produces analog output signals for a speaker 614. The speaker 614 can be a speaker internal to the mobile multi-function device 600 or external to the mobile multi-function device 600. For example, headphones or earphones that connect to the mobile multi-function device 600 would be considered an external speaker.

In one embodiment, the mobile multi-function device 600 can also support a remote controller 613 that can be connected to the mobile multi-function device 600. The remote controller 613 can be removable connected to the mobile multi-function device 600 by a cord (or cable). For example, as shown in FIG. 1, the controller 116 can couple to the cord 108 which can connect to the portable media player 102. Alternatively, the remote controller 613 could be wirelessly connected to the mobile multi-function device 600. The remote controller 613 is remotely position from the mobile multi-function device 600. In contrast, the user input device 608 is attached, integral or proximate to the mobile multi-function device 600. The remote controller 613 can through user manipulation control one or more function or operations on the mobile multi-function device. A microphone 617 can also be attached, integral or proximate to the remote controller 613. When the remote controller 613 is provided on a cord, the cord can also support one or more earpieces 615 (which can also be a headset) (see FIG. 1).

The mobile multi-function device 600 also includes a bus interface 616 that couples to a data link 618. The data link 618 allows the mobile multi-function device 600 to couple to a host device (e.g., host computer or power source). The data link 618 can also provide power to the mobile multi-function device 600.

The mobile multi-function device 600 illustrated in FIG. 6 represents only one embodiment of a mobile device suitable for use with the invention. Other embodiments can be significantly different. For example, other embodiments need not provide a wireless voice communications function.

The various aspects, embodiments, implementations or features of the invention can be used separately or in any combination.

Depending on implementation or embodiment, the invention may be implemented by materials, device, software, hardware, or a combination therof. Certain implementations or embodiments can also be embodied as computer readable code on a computer readable medium. The computer readable medium is any data storage device that can store data which can thereafter be read by a computer system. Examples of the computer readable medium generally include read-only memory and random-access memory. More specific examples of computer readable medium are tangible and include Flash memory, EEPROM memory, memory card, CD-ROM, DVD, hard drive, magnetic tape, and optical data storage device. The computer readable medium can also be distributed over network-coupled computer systems so that the computer readable code is stored and executed in a distributed fashion.

The advantages of the invention are numerous. Different aspects, embodiments or implementations may, but need not, yield one or more of the following advantages. One advantage of certain embodiments is that users of mobile electronic devices can use controllers that are remote from the corresponding mobile electronic devices to at least partially control the portable electronic devices. Another advantage of certain embodiments is that a controller for a portable electronic device can be intuitive in its usage and can have a relatively small size. Still another advantage of certain embodiments is that specific user finger positioning with respect to a controller for a portable electronic device is not required for user interaction with the controller.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A deformable controller for a portable electronic device, the controller comprising:
   a deformable outer shell;
   a plurality of electrical contacts disposed within the deformable outer shell, the plurality of electrical contacts comprising:
   a central electrical contact positioned at a center region of the deformable outer shell; and
   a plurality of outer electrical contacts coupled to at least a portion of an inner surface of the deformable outer shell and positioned around the central electrical contact, wherein, in response to an external force being applied to at least a portion of an outer surface of the deformable outer shell, at least one outer electrical contact of the plurality of outer electrical contacts interacts with the central electrical contact to request at least one function of a plurality of predetermined functions associated with the portable electronic device.

2. A deformable controller as recited in claim 1, wherein the external force comprises one of a rolling user interaction, a twisting user interaction, and a pressing user interaction with the at least a portion of the deformable outer shell.

3. A deformable controller as recited in claim 1, wherein the at least one outer electrical contact of the plurality of outer electrical contacts is flexible.

4. A deformable controller as recited in claim 1, wherein the at least one outer electrical contact of the plurality of outer electrical contacts is at least partially molded onto the at least a portion of the inner surface of the deformable outer shell.

5. A deformable controller as recited in claim 1, wherein the central electrical contact is positioned along a central axis of the deformable outer shell.

6. A deformable controller as recited in claim 5, wherein the plurality of outer electrical contacts is positioned about the central axis.

7. A deformable controller as recited in claim 6, wherein the deformable controller is connected to a cable along the central axis.

8. A deformable controller as recited in claim 1, wherein the deformable outer shell comprises a symmetrical outer shape.

9. The deformable controller of claim 1, wherein, in response to another external force being applied to at least another portion of the deformable outer shell, at least another outer electrical contact of the plurality of outer electrical contacts interacts with the central electrical contact to request at least another function of the plurality of predetermined functions.

* * * * *